(12) United States Patent
Yagi et al.

(10) Patent No.: US 11,230,502 B2
(45) Date of Patent: Jan. 25, 2022

(54) COMPOSITE SINTERED BODY, SEMICONDUCTOR MANUFACTURING APPARATUS MEMBER, AND METHOD OF MANUFACTURING COMPOSITE SINTERED BODY

(71) Applicant: NGK INSULATORS, LTD., Nagoya (JP)

(72) Inventors: En Yagi, Nagoya (JP); Yuji Katsuda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 262 days.

(21) Appl. No.: 16/354,800

(22) Filed: Mar. 15, 2019

(65) Prior Publication Data
US 2019/0292105 A1    Sep. 26, 2019

(30) Foreign Application Priority Data

Mar. 23, 2018  (WO) ................. PCT/JP2018/011775
Feb. 8, 2019   (JP) ............................ JP2019-021966

(51) Int. Cl.
   *C04B 35/581*   (2006.01)
   *B28B 11/24*    (2006.01)
   (Continued)

(52) U.S. Cl.
   CPC .......... *C04B 35/581* (2013.01); *B28B 11/243* (2013.01); *C04B 35/443* (2013.01);
   (Continued)

(58) Field of Classification Search
   CPC . C04B 35/581; C04B 35/443; C04B 35/6303; C04B 35/645; C04B 2235/3222;
   (Continued)

(56) References Cited

U.S. PATENT DOCUMENTS 4,719,187 A  *  1/1988  Bardhan ............... C04B 35/581
                                                 501/151
6,239,402 B1     5/2001  Araki et al.
                         (Continued)

FOREIGN PATENT DOCUMENTS

JP    H04-342468 A1    11/1992
JP    H04342468    *   11/1992
                (Continued)

OTHER PUBLICATIONS

Taiwanese Office Action (Application No. 108109441) dated Apr. 29, 2020.

*Primary Examiner* — Karl E Group
*Assistant Examiner* — Cameron K Miller
(74) *Attorney, Agent, or Firm* — Burr & Brown, PLLC

(57) ABSTRACT

The composite sintered body includes AlN and $MgAl_2O_4$. The open porosity of the composite sintered body is lower than 0.1%. The relative density of the composite sintered body is not lower than 99.5%. The total percentage of the AlN and the $MgAl_2O_4$ contained in the composite sintered body is not lower than 95 weight percentage and not higher than 100 weight percentage. The percentage of the $MgAl_2O_4$ contained in the composite sintered body is not lower than 15 weight percentage and not higher than 70 weight percentage. It is thereby possible to provide a high-density composite sintered body having high plasma corrosion resistance, high volume resistivity, and high thermal conductivity.

13 Claims, 3 Drawing Sheets

(51) Int. Cl.

| | |
|---|---|
| *C04B 35/443* | (2006.01) |
| *C04B 35/645* | (2006.01) |
| *C04B 35/63* | (2006.01) |
| *H01J 37/32* | (2006.01) |
| *H01L 21/683* | (2006.01) |
| *H01L 21/67* | (2006.01) |
| *H05B 1/02* | (2006.01) |

(52) U.S. Cl.
CPC ........ *C04B 35/6303* (2013.01); *C04B 35/645* (2013.01); *H01J 37/32724* (2013.01); *H01L 21/67103* (2013.01); *H01L 21/6833* (2013.01); *H05B 1/0233* (2013.01); *C04B 2235/3222* (2013.01); *C04B 2235/3865* (2013.01); *C04B 2235/602* (2013.01); *C04B 2235/763* (2013.01); *C04B 2235/80* (2013.01); *C04B 2235/9607* (2013.01); *C04B 2235/9669* (2013.01)

(58) Field of Classification Search
CPC ...... C04B 2235/3865; C04B 2235/602; C04B 2235/763; C04B 2235/80; C04B 2235/9607; C04B 2235/9669; B28B 11/243; H01J 37/32724; H01L 21/67103; H01L 21/6833; H05B 1/0233
See application file for complete search history.

(56) References Cited

U.S. PATENT DOCUMENTS

| | | |
|---|---|---|
| 2004/0182321 A1 | 9/2004 | Kuibira et al. |
| 2006/0217259 A1 | 9/2006 | Teratani et al. |
| 2010/0104892 A1* | 4/2010 | Kobayashi ........ C04B 35/62815 428/698 |
| 2017/0117120 A1 | 4/2017 | Sato et al. |
| 2017/0127475 A1 | 5/2017 | Nagai et al. |

FOREIGN PATENT DOCUMENTS

| | | |
|---|---|---|
| JP | H05-190255 A1 | 7/1993 |
| JP | 2000-044345 A1 | 2/2000 |
| JP | 2002-220282 A1 | 8/2002 |
| JP | 2002220282 * | 8/2002 |
| JP | 4641569 B2 | 3/2011 |
| TW | 200403705 A | 3/2004 |
| TW | 201022180 A1 | 6/2010 |
| TW | 201731013 A | 9/2017 |

* cited by examiner

COMPOSITE SINTERED BODY, SEMICONDUCTOR MANUFACTURING APPARATUS MEMBER, AND METHOD OF MANUFACTURING COMPOSITE SINTERED BODY

BACKGROUND OF THE INVENTION

1. Field of the Invention

The present invention relates to a composite sintered body, a semiconductor manufacturing apparatus member, and a method of manufacturing a composite sintered body.

2. Description of Related Art

In an apparatus of manufacturing a semiconductor substrate, conventionally, a plasma treatment such as film formation, etching, and the like using plasma generated by exciting a process gas is performed on a semiconductor substrate supported by a susceptor.

In a susceptor disclosed in Patent Publication No. 4641569 (Document 1), for example, a resistance heating element and an electrode are buried inside a corrosion resistant member formed of an aluminum nitride sintered body. In order to ensure increase of plasma corrosion resistance and higher resistance, the corrosion resistant member is formed by performing hot-press sintering with magnesium oxide in an amount from 0.1 weight percentage to 10 weight percentage added to aluminum nitride. Further, high thermal conductivity is required of the corrosion resistant member.

Furthermore, Japanese Patent Application Laid-Open No. 2002-220282 (Document 2) proposes a technique for obtaining an aluminum nitride sintered body having high thermal conductivity and high volume resistivity by adding a rare earth compound and $MgAl_2O_4$ to aluminum nitride and sintering it. Document 2 discloses Examples and Comparative examples in which the addition amount of yttrium oxide ($Y_2O_3$) and $MgAl_2O_4$ to aluminum nitride is changed, and in Example 5 in which the addition amount of $MgAl_2O_4$ is largest among the Examples, $MgAl_2O_4$ of 15 parts by weight is added to aluminum nitride of 100 parts by weight and yttrium oxide ($Y_2O_3$) of 5 parts by weight. In other words, the percentage of $MgAl_2O_4$ contained in the aluminum nitride sintered body in Example 5 is 12.5 weight percentage.

In Japanese Patent Application Laid-Open No. 5-190255 (Document 3), in order to improve hot insulation resistance by grain boundary phase, magnesium is added before sintering in an insulator for aluminum nitride-made spark plug. The percentage of magnesium contained in a sintered body is 0.001 to 0.3 weight percentage.

In the corrosion resistant member disclosed in Document 1, when the addition amount of magnesium oxide is increased in order to improve the plasma corrosion resistance, the volume resistivity at 700° C. is reduced with the addition amount of magnesium oxide in a range not lower than 5 weight percentage. When the volume resistivity of the corrosion resistant member is low, leakage current is generated between the resistance heating element and the electrode inside the corrosion resistant member, and there is a possibility that control over heating temperature of semiconductor substrates and plasma to be applied to the semiconductor substrates may be disturbed.

Further, Document 2 shows an exemplary case, as Comparative example 1, where the percentage of $MgAl_2O_4$ contained in the aluminum nitride sintered body is 16 weight percentage and describes that when the content percentage of $MgAl_2O_4$ is higher like in this case, a dense sintered body cannot be obtained and the thermal conductivity is reduced. For information, the relative density of the aluminum nitride sintered body in Comparative example 1 is low, specifically 98.9%, and that of the aluminum nitride sintered body in above-described Example 5 is also not high, specifically 99.1%. Document 3 describes that a magnesium compound is easily sublimated in a process of sintering and that when the percentage of magnesium contained in a sintered body exceeds 0.3 weight percentage, pores are generated in the sintered body due to the sublimation of the magnesium compound and the electrical properties are thereby degraded.

SUMMARY OF THE INVENTION

The present invention is intended for a composite sintered body, and it is an object of the present invention to provide a high-density composite sintered body having high plasma corrosion resistance, high volume resistivity, and high thermal conductivity.

The composite sintered body according to one preferred embodiment of the present invention includes aluminum nitride and spinel. The open porosity of the composite sintered body is lower than 0.1%. The relative density of the composite sintered body is not lower than 99.5%. The total percentage of the aluminum nitride and the spinel contained in the composite sintered body is not lower than 95 weight percentage and not higher than 100 weight percentage. The percentage of the spinel contained in the composite sintered body is not lower than 15 weight percentage and not higher than 70 weight percentage. By the present invention, it is possible to provide a high-density composite sintered body having high plasma corrosion resistance, high volume resistivity, and high thermal conductivity.

Preferably, the percentage of magnesium oxide as a constituent crystal phase contained in the composite sintered body is substantially 0 weight percentage.

Preferably, the lattice constant of the spinel is not lower than 8.075 angstrom.

Preferably, magnesium is solid-solved in the aluminum nitride.

Preferably, assuming that the plasma etching rate of a sintered body containing aluminum nitride in an amount of 100 weight percentage is 1, the plasma etching rate of the composite sintered body is not higher than 0.5.

Preferably, the volume resistivity of the composite sintered body at 700° C. is not lower than $7.0 \times 10^7$ Ω·cm.

Preferably, the thermal conductivity of the composite sintered body at 600° C. is not lower than 15 W/m·K.

The present invention is also intended for a semiconductor manufacturing apparatus member used in a semiconductor manufacturing apparatus. The semiconductor manufacturing apparatus member according to one preferred embodiment of the present invention is formed by using the above-described composite sintered body. By the present invention, it is possible to provide a high-density semiconductor manufacturing apparatus member having high plasma corrosion resistance, high volume resistivity, and high thermal conductivity.

Preferably, the semiconductor manufacturing apparatus member includes a plate-like main body formed by using the composite sintered body, having an upper surface on which a semiconductor substrate is placed, a resistance heating element disposed inside the main body, and an internal electrode disposed between the resistance heating element and the upper surface of the main body inside the main body.

The present invention is still also intended for a method of manufacturing a composite sintered body. The method of manufacturing a composite sintered body according to one preferred embodiment of the present invention includes a) molding mixed powder in which aluminum nitride and an additive containing magnesium and aluminum are mixed, into a green body having a predetermined shape and b) generating a composite sintered body containing aluminum nitride and spinel by hot-press sintering of the green body. In the operation a), the total percentage of the aluminum nitride and the additive contained in the mixed powder is not lower than 95 weight percentage and not higher than 100 weight percentage. The mixed powder contains magnesium in an amount of not lower than 5 weight percentage and not higher than 18 weight percentage in terms of magnesium oxide and aluminum in an amount of not lower than 10 weight percentage and not higher than 44 weight percentage in terms of aluminum oxide. By the present invention, it is possible to easily manufacture a high-density composite sintered body having high plasma corrosion resistance, high volume resistivity, and high thermal conductivity.

Preferably, the additive contains spinel and magnesium oxide.

Preferably, the additive contains magnesium oxide and aluminum oxide.

These and other objects, features, aspects and advantages of the present invention will become more apparent from the following detailed description of the present invention when taken in conjunction with the accompanying drawings.

DETAILED DESCRIPTION OF THE INVENTION

Figure 1:
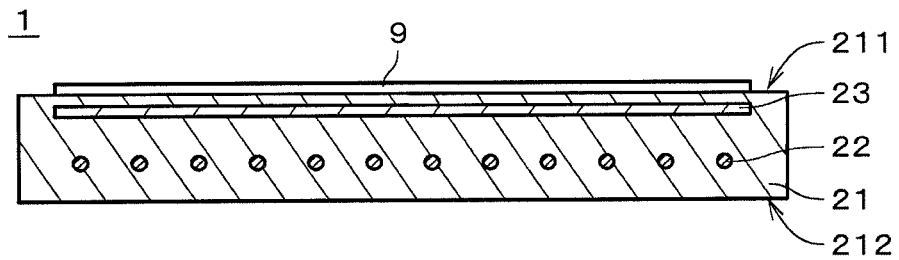
FIG. 1 is a cross section showing a susceptor 1 in accordance with one preferred embodiment.

FIG. 1 is a cross section showing a susceptor 1 in accordance with one preferred embodiment of the present invention. The susceptor 1 is a semiconductor manufacturing apparatus member used in a semiconductor manufacturing apparatus. The susceptor 1 holds a semiconductor substrate 9 (hereinafter, referred to simply as a "substrate 9") having a substantially disk-like shape from the lower side in FIG. 1. In the following description, the upper side and the lower side of FIG. 1 will be referred to simply as an "upper side" and a "lower side", respectively. Further, the up-and-down direction of FIG. 1 will be referred to simply as an "up-and-down direction". The up-and-down direction of FIG. 1 does not necessarily have to coincide with an actual up-and-down direction in a case where the susceptor 1 is placed on the semiconductor manufacturing apparatus.

The susceptor 1 includes a main body 21, a resistance heating element 22, and an internal electrode 23. The main body 21 is a substantially plate-like (e.g., substantially disk-like) member formed by using a composite sintered body described later. On an upper surface 211 of the main body 21, placed is the substrate 9. The resistance heating element 22 and the internal electrode 23 are disposed (buried) inside the main body 21. Inside the main body 21, the resistance heating element 22 is disposed between the internal electrode 23 and a lower surface 212 of the main body 21. In other words, the internal electrode 23 is disposed between the resistance heating element 22 and the upper surface 211 of the main body 21.

The resistance heating element 22 is formed of, for example, a metal wire wound into a coiled shape. The resistance heating element 22 is a continuous member wired with a substantially concentric pattern over a substantially entire surface of the main body 21 in a plan view. In the semiconductor manufacturing apparatus, when electric power is supplied to the resistance heating element 22 from a not-shown power supply source, the resistance heating element 22 generates heat and the temperature of the main body 21 increases. The substrate 9 placed on the upper surface 211 of the main body 21 is thereby heated to a predetermined temperature. The resistance heating element 22 is a heater electrode for heating the substrate 9.

The internal electrode 23 is, for example, a substantially disk-like metal member. The internal electrode 23 is, for example, an RF electrode (i.e., high-frequency electrode) for plasma treatment. In the semiconductor manufacturing apparatus, high frequency power (radiofrequency power) is supplied to the internal electrode 23 from a not-shown high frequency power supply. In a processing space between the susceptor 1 and an upper electrode disposed above the susceptor 1, a process gas is excited, to thereby generate plasma. Then, with this plasma, a plasma treatment such as film formation, etching, and the like is performed on the substrate 9.

It is preferable that the resistance heating element 22 and the internal electrode 23 should be each formed of a metal having a relatively high melting point. As such a metal, for example, used is tantalum (Ta), tungsten (W), molybdenum (Mo), platinum (Pt), rhenium (Re), hafnium (Hf), or an alloy thereof.

The main body 21 of the susceptor 1 is formed by using a composite sintered body containing aluminum nitride (AlN) and spinel ($MgAl_2O_4$). Hereinafter, description will be made assuming that the whole main body 21 is formed by using the composite sintered body.

The main phase of the composite sintered body forming the main body 21 (hereinafter, referred to simply as a "composite sintered body") is above-described AlN and $MgAl_2O_4$. Specifically, the total percentage of AlN and $MgAl_2O_4$ contained in the composite sintered body is from 95 weight percentage to 100 weight percentage, and preferably from 98 weight percentage to 100 weight percentage. Further, the percentage of $MgAl_2O_4$ contained in the composite sintered body is from 15 weight percentage to 70 weight percentage, preferably from 20 weight percentage to 60 weight percentage, and more preferably from 25 weight percentage to 50 weight percentage. The percentage of AlN contained in the composite sintered body is from 25 weight percentage to 85 weight percentage, preferably from 35 weight percentage to 80 weight percentage, and more preferably from 45 weight percentage to 75 weight percentage.

It is preferable that the lattice constant of $MgAl_2O_4$ contained in the composite sintered body should be not lower than 8.075 angstrom. In the composite sintered body, preferably, magnesium is solid-solved in AlN. Preferably, the composite sintered body contains substantially no magnesium oxide (MgO) crystal phase. In other words, it is preferable that the percentage of MgO crystal phase contained in the composite sintered body should be substantially 0 weight percentage.

The open porosity of the composite sintered body is lower than 0.1%, and preferably lower than 0.05%. The relative density of the composite sintered body is not lower than 99.5%, and preferably not lower than 99.7%. The volume resistivity of the composite sintered body at 700° C. is preferably not lower than $7.0 \times 10^7$ Ω·cm, more preferably not lower than $1.0 \times 10^8$ Ω·cm, and further preferably not lower than $3.0 \times 10^8$ Ω·cm. The upper limit of the volume resistivity is not particularly restricted but typically the volume resistivity is not higher than $1.0 \times 10^{10}$ Ω·cm. The thermal conductivity of the composite sintered body at 600° C. is preferably not lower than 15 W/m·K, more preferably not lower than 20 W/m·K, and further preferably not lower than 30 W/m·K. The upper limit of the thermal conductivity is not particularly restricted but typically the thermal conductivity is not higher than 50 W/m·K.

Figure 2:
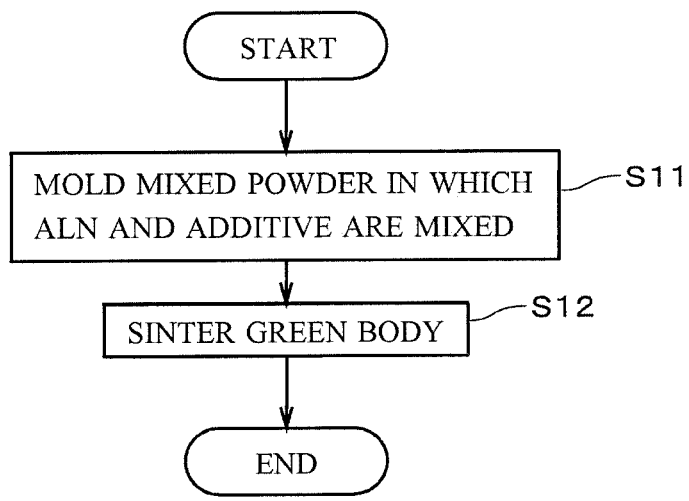
FIG. 2 is a flowchart showing an operation flow for manufacturing a composite sintered body.

Next, with reference to FIG. 2, a method of manufacturing the above-described composite sintered body (i.e., the main body 21 of the susceptor 1) will be described. For manufacturing the composite sintered body, first, obtained is a mixed powder in which AlN and an additive are mixed. The additive contains magnesium (Mg) and aluminum (Al). Then, the mixed powder is molded into a green body having a predetermined shape (Step S11). In Step S11, for example, powders of AlN and the additive are wet-mixed in an organic solvent, to thereby become a slurry. Subsequently, the slurry is dried to become mixed powder (i.e., prepared powder), and the mixed powder is molded into the above-described green body. Further, the powders of AlN and the additive may be dry-mixed, instead of being wet-mixed.

The mixed powder is filled into, for example, a hot press die, to be thereby formed into a green body having a predetermined shape. When the shape of the green body is a plate-like shape, the mixed powder may be filled into a die for uniaxial pressing, or the like, to be thereby molded. Formation of the green body may be performed by any one of various other methods only if the shape can be maintained. Further, like the above-described slurry, the mixed powder may be formed into a green body having a predetermined shape by inpouring the mixed powder in a fluid state into a mold and then removing the solvent component. The green body formed in Step S11, for example, has a substantially disk-like shape which is substantially the same shape as that of the main body 21.

In Step S11, the total percentage of AlN and the additive contained in the above-described mixed powder is from 95 weight percentage to 100 weight percentage. The mixed powder contains Mg in an amount from 5 weight percentage to 18 weight percentage in terms of MgO and Al in an amount from 10 weight percentage to 44 weight percentage in terms of aluminum oxide ($Al_2O_3$). The additive contains, for example, $MgAl_2O_4$ and MgO. Alternatively, the additive may contain MgO and $Al_2O_3$. Further, the additive may contain $MgAl_2O_4$, MgO, and $Al_2O_3$.

After the green body is obtained in Step S11, hot-press sintering of the green body is performed and the above-described composite sintered body containing AlN and $MgAl_2O_4$ is thereby generated (Step S12). In Step S12, the green body is arranged in the hot press die (e.g., carbon jig) and then heated and pressurized, and the composite sintered body is thereby obtained. Sintering of the green body is performed, for example, under vacuum atmosphere or non-oxidizing atmosphere. The heating temperature, the press pressure, and the sintering time at the hot press may be determined as appropriate. The maximum heating temperature is preferably from 1650° C. to 1800° C.

In Step S12, since the hot press die has high hermeticity, it is possible to suppress generation of Mg due to reduction of MgO in $MgAl_2O_4$. It is thereby possible to suppress generation of pores in the composite sintered body due to volatilization of the reduced Mg (having a boiling point of 1091° C.). As a result, it is possible to obtain a high-density composite sintered body (i.e., dense composite sintered body).

When the above-described additive contains $MgAl_2O_4$ and MgO and does not contain $Al_2O_3$, in the hot-press sintering in Step S12, MgO contained in the additive reacts with $Al_2O_3$ which is inevitably contained as impurities in the AlN powder (i.e., an oxide film or the like generated on powder surfaces of AlN and hereinafter, also referred to as "impurity $Al_2O_3$"), to thereby generate $MgAl_2O_4$. Therefore, it is preferable that the amount of substance of MgO contained in the additive should be substantially equal to that of $Al_2O_3$ contained as impurities in the AlN powder. When the amount of substance of MgO in the additive is larger than that of the impurity $Al_2O_3$, MgO which does not react with the impurity $Al_2O_3$ remains in the composite sintered body generated in Step S12.

When the additive contains MgO and $Al_2O_3$ and does not contain $MgAl_2O_4$, in the hot-press sintering in Step S12, MgO contained in the additive reacts with $Al_2O_3$ contained in the additive and the impurity $Al_2O_3$ in AlN, to thereby generate $MgAl_2O_4$. Therefore, it is preferable that the amount of substance of MgO contained in the additive should be substantially equal to the total of that of $Al_2O_3$ in the additive and that of the impurity $Al_2O_3$. When the amount of substance of MgO in the additive is larger than the total of that of $Al_2O_3$ in the additive and that of the impurity $Al_2O_3$, MgO which does not react with $Al_2O_3$ remains in the composite sintered body generated in Step S12. The same applies to a case where the additive contains $MgAl_2O_4$, MgO, and $Al_2O_3$.

The resistance heating element 22 and the internal electrode 23 may be generated inside the main body 21, for example, by burying a metal material inside the above-described green body in parallel with Step S11 and sintering the metal material together with the green body in Step S12. Alternatively, the resistance heating element 22 and the internal electrode 23 may be arranged inside the main body 21 formed of the two composite sintered bodies generated in Steps S11 and S12 by sandwiching the resistance heating element 22 and the internal electrode 23 between the two composite sintered bodies. Generation and arrangement of the resistance heating element 22 and the internal electrode 23 may be performed by any one of various methods.

Next, with reference to Tables 1 to 3, Examples 1 to 19 of the composite sintered body of the present invention and composite sintered bodies of Comparative examples 1 to 11 to be compared with the composite sintered body of the present invention will be described. Table 1 shows raw material compositions and sintering temperatures. In respective columns for the raw material compositions, shown are respective parts by weight of the other raw materials relative to 100 parts by weight of AlN (i.e., weight ratios relative to AlN raw material).

As shown in Table 1, in Comparative example 1, only AlN is the raw material and the additive such as MgO, $MgAl_2O_4$, $Al_2O_3$, or the like is not contained in the raw material. In Comparative examples 2 to 5, only MN and MgO are contained in the raw material and MgAl$_2$O$_4$ or Al$_2$O$_3$ is not contained in the raw material.

In Examples 1 to 12 and 18 to 19 and Comparative examples 6 to 11, the raw material contains MgAl$_2$O$_4$. In Example 18 and Comparative example 6, the raw material contains AlN and MgAl$_2$O$_4$ and does not contain MgO or Al$_2$O$_3$. In Examples 1 to 12 and 19 and Comparative examples 7 to 11, the raw material contains AlN, MgO, and MgAl$_2$O$_4$ and does not contain Al$_2$O$_3$. Among Examples 1 to 4 and Comparative examples 6 to 9, Examples 5 to 8 and 18 to 19 and Comparative example 10, and Examples 9 to 12 and Comparative example 11, the sintering temperature is different. In Examples 13 to 17, the raw material contains AlN, MgO, and Al$_2$O$_3$ and does not contain MgAl$_2$O$_4$. In Examples 14 to 17, Al$_2$O$_3$ contained in the raw material is obtained by performing heat treatment (e.g., at 900° C.) of AlN contained in the raw material in the atmosphere and oxidizing AlN, instead of adding Al$_2$O$_3$ powder. In Examples 15 to 17, in order to check any effect of zirconium oxide (ZrO$_2$) which is an impurity having a possibility of being mixed during mixing or the like by a ball mill described later, a small amount of ZrO$_2$ powder is added to the raw material, separately from the impurity.

<Raw Material Powder>

AlN used as the raw material is commercially-available AlN powder having an average particle diameter of 1.3 µm and oxygen content of 0.8 weight percentage. MgO used as the raw material is commercially-available MgO powder having an average particle diameter of 1.2 µm and purity of 99.9% or higher. Al$_2$O$_3$ used as the raw material is commercially-available Al$_2$O$_3$ powder having an average particle diameter of 0.2 µm and purity of 99.9% or higher. ZrO$_2$ used as the raw material is commercially-available ZrO$_2$ powder having a specific surface area of 15 m$^2$/g and purity of 99.9% or higher.

MgAl$_2$O$_4$ used as the raw material is MgAl$_2$O$_4$ powder prepared by the following method. For preparing the MgAl$_2$O$_4$ powder, first, the above-described commercially-available MgO powder (having an average particle diameter of 1.2 µm and purity of 99.9% or higher) and the above-described commercially-available Al$_2$O$_3$ powder (having an average particle diameter of 0.2 µm and purity of 99.9% or higher) are weighed with an equal amount of substance (i.e., equivalent mol amount) and wet-mixed in the ball mill for four hours. A solvent used in the wet mixture is isopropyl alcohol (IPA). Further, balls of the ball mill are made of ZrO$_2$. Subsequently, a slurry obtained by the wet mixture is dried under nitrogen (N$_2$) atmosphere and sieved by 100 mesh sieve.

Next, heat treatment is performed on the sieved powder at 1300° C. in the atmosphere, to thereby generate MgAl$_2$O$_4$ synthetic powder, and the synthetic powder is wet-milled in the ball mill for six hours. A solvent used in the wet milling is IPA. Further, the balls of the ball mill are made of ZrO$_2$. Then, a slurry obtained by the wet milling is dried under the N$_2$ atmosphere and sieved by 100 mesh sieve, to thereby obtain the MgAl$_2$O$_4$ powder which is to become the raw material. The average particle diameter of the MgAl$_2$O$_4$ powder is 0.2 µm.

<Mixed Powder>

The raw material powder is weighed to have an amount (weight percentage) shown in Table 1 and wet-mixed in the ball mill for 20 hours. A solvent used in the wet mixture is IPA. Further, the balls of the ball mill are made of ZrO$_2$. Then, a slurry obtained by the wet mixture is dried under the N$_2$ atmosphere and sieved by 100 mesh sieve, to thereby obtain mixed powder which is to become the raw material. The percentage of ZrO$_2$ which is an impurity caused by the balls made of ZrO$_2$, contained in the mixed powder is from 0.5 to 1.5 weight percentage.

<Molding>

Uniaxial pressing of the mixed powder is performed with a pressure of 100 to 150 kgf/cm$^2$, to thereby form a disk-like green body having a diameter (p) of 50 nm and a thickness of about 20 mm, and the green body is accommodated in the hot-press die. The molding pressure is not particularly limited but may be variously changed only if the shape can be maintained. The mixed powder may be filled into the hot-press die in a state of unmolded powder.

<Sintering>

The above-described green body is sintered by the hot-press method. The press pressure is 200 kgf/cm$^2$. The maximum temperature at heating is from 1650° C. to 1800° C., and the holding time at the maximum temperature is eight hours. After holding the green body at the maximum temperature for eight hours, the green body is cooled to 1200° C. by 300° C. per hour, and the sintering is completed. The sintering atmosphere is the vacuum atmosphere between the room temperature and 1000° C., and after the temperature reaches 1000° C., N$_2$ gas is introduced by 1.5 atmospheric pressure (0.152 MPa).

TABLE 1

| | Preparation Condition | | | | | |
|---|---|---|---|---|---|---|
| | Raw Material Composition | | | | | |
| | AlN W/T Parts | MgO W/T Parts | MgAl$_2$O$_4$ W/T Parts | Al$_2$O$_3$ W/T Parts | ZrO$_2$ W/T Parts | Sintering Temperature ° C. |
| Comparative Example 1 | 100 | — | — | — | — | 1800 |
| Comparative Example 2 | 100 | 0.3 | — | — | — | 1800 |
| Comparative Example 3 | 100 | 1.0 | — | — | — | 1800 |
| Comparative Example 4 | 100 | 5.0 | — | — | — | 1800 |
| Comparative Example 5 | 100 | 10.0 | — | — | — | 1800 |
| Comparative Example 6 | 100 | — | 5.3 | — | — | 1800 |
| Comparative Example 7 | 100 | 1.7 | 5.3 | — | — | 1800 |
| Comparative Example 8 | 100 | 3.0 | 5.3 | — | — | 1800 |
| Comparative Example 9 | 100 | 1.7 | 14 | — | — | 1800 |
| Example 1 | 100 | 1.7 | 18 | — | — | 1800 |
| Example 2 | 100 | 1.7 | 25 | — | — | 1800 |
| Example 3 | 100 | 1.7 | 82 | — | — | 1800 |
| Example 4 | 100 | 1.7 | 150 | — | — | 1800 |
| Comparative Example 10 | 100 | 1.7 | 14 | — | — | 1700 |
| Example 5 | 100 | 1.7 | 18 | — | — | 1700 |
| Example 6 | 100 | 1.7 | 25 | — | — | 1700 |
| Example 7 | 100 | 1.7 | 82 | — | — | 1700 |
| Example 8 | 100 | 1.7 | 150 | — | — | 1700 |
| Comparative Example 11 | 100 | 1.7 | 14 | — | — | 1650 |
| Example 9 | 100 | 1.7 | 18 | — | — | 1650 |
| Example 10 | 100 | 1.7 | 25 | — | — | 1650 |
| Example 11 | 100 | 1.7 | 82 | — | — | 1650 |
| Example 12 | 100 | 1.7 | 150 | — | — | 1650 |
| Example 13 | 100 | 8.8 | — | 18 | — | 1700 |
| Example 14 | 100 | 8.8 | — | 18* | — | 1700 |
| Example 15 | 100 | 8.8 | — | 18* | 0.5 | 1700 |
| Example 16 | 100 | 8.8 | — | 18* | 1.0 | 1700 |
| Example 17 | 100 | 8.8 | — | 18* | 2.0 | 1700 |
| Example 18 | 100 | 0.0 | 82 | — | — | 1700 |
| Example 19 | 100 | 0.8 | 82 | — | — | 1700 |

*Al$_2$O$_3$ in Examples 14 to 17 is generated by oxidizing AlN raw material powder at 900° C. under the atmosphere.

TABLE 2

| | Sintered Body Properties | | | | | |
|---|---|---|---|---|---|---|
| | Volume Resistivity | | | | Thermal Conductivity | |
| | Room Temperature Ω · cm | 600° C. Ω · cm | 700° C. Ω · cm | Relative Etching Rate | Room Temperature W/m · K | 600° C. W/m · K |
| Comparative Example 1 | — | 1.5E+08 | <1.0E+7 | 1.00 | 88 | — |
| Comparative Example 2 | — | 8.2E+08 | <1.0E+7 | 0.76 | 78 | — |
| Comparative Example 3 | — | 1.1E+12 | 9.3E+08 | 0.60 | 71 | — |
| Comparative Example 4 | — | 6.1E+09 | 8.2E+07 | 0.42 | 47 | — |
| Comparative Example 5 | — | 8.3E+09 | 5.5E+07 | 0.33 | 36 | — |
| Comparative Example 6 | 6.5E+15 | 4.8E+09 | 7.2E+07 | 0.50 | 70 | 41 |
| Comparative Example 7 | 3.0E+15 | 1.5E+10 | 2.1E+08 | 0.47 | 69 | 40 |
| Comparative Example 8 | 2.5E+15 | 6.2E+09 | 8.2E+07 | 0.45 | 60 | 34 |
| Comparative Example 9 | 5.2E+15 | 1.5E+10 | 2.4E+08 | 0.46 | 63 | 39 |
| Example 1 | 7.8E+15 | 1.4E+10 | 3.5E+08 | 0.43 | 59 | 34 |
| Example 2 | 9.8E+15 | 1.2E+10 | 3.3E+08 | 0.39 | 54 | 31 |
| Example 3 | 2.0E+16 | 1.3E+10 | 3.5E+08 | 0.30 | 35 | 24 |
| Example 4 | 3.2E+16 | 2.1E+10 | 4.0E+08 | 0.26 | 22 | 18 |
| Comparative Example 10 | 4.6E+15 | 1.6E+10 | 4.0E+08 | 0.48 | 68 | 38 |
| Example 5 | 6.2E+15 | 1.5E+10 | 4.5E+08 | 0.44 | 62 | 36 |
| Example 6 | 6.0E+15 | 1.6E+10 | 7.1E+08 | 0.41 | 50 | 30 |
| Example 7 | 2.7E+16 | 2.1E+10 | 7.2E+08 | 0.31 | 34 | 23 |
| Example 8 | 3.4E+16 | 2.6E+10 | 8.1E+08 | 0.26 | 22 | 17 |
| Comparative Example 11 | 6.0E+15 | 1.2E+10 | 3.0E+08 | 0.50 | 66 | 37 |
| Example 9 | 5.4E+15 | 1.4E+10 | 3.2E+08 | 0.47 | 61 | 36 |
| Example 10 | 1.0E+16 | 1.4E+10 | 4.3E+08 | 0.43 | 49 | 30 |
| Example 11 | 2.0E+16 | 2.8E+10 | 4.7E+08 | 0.33 | 33 | 23 |
| Example 12 | 2.5E+16 | 1.6E+10 | 5.2E+08 | 0.29 | 21 | 17 |
| Example 13 | 4.2E+15 | 2.5E+10 | 4.0E+08 | 0.39 | 49 | 31 |
| Example 14 | 4.0E+15 | 3.0E+10 | 6.2E+08 | 0.39 | 50 | 30 |
| Example 15 | 4.0E+10 | 2.9E+10 | 6.5E+08 | 0.38 | 48 | 30 |
| Example 16 | 3.5E+15 | 3.2E+10 | 7.7E+08 | 0.37 | 47 | 29 |
| Example 17 | 2.2E+15 | 2.0E+10 | 3.5E+08 | 0.37 | 47 | 30 |
| Example 18 | 1.2E+16 | 6.8E+10 | 2.0E+09 | 0.33 | 34 | 23 |
| Example 19 | 2.2E+16 | 3.0E+10 | 1.0E+09 | 0.32 | 33 | 23 |

TABLE 3

| | Sintered Body Properties | | | | | |
|---|---|---|---|---|---|---|
| | Constituent Phase | MgAl$_2$O$_4$ Weight % | Lattice Constant of MgAl$_2$O$_4$ angstrom | Open Porosity % | Bulk Density g/cm$^3$ | Relative Density % |
| Comparative Example 1 | AlN | — | — | — | 3.26 | 99.8 |
| Comparative Example 2 | AlN | — | — | — | 3.26 | 99.8 |
| Comparative Example 3 | AlN, MgO | — | — | — | 3.26 | 99.7 |
| Comparative Example 4 | AlN, MgO | — | — | — | 3.27 | 99.7 |
| Comparative Example 5 | AlN, MgO | — | — | — | 3.27 | 99.6 |
| Comparative Example 6 | AlN, MgAl$_2$O$_4$, ZrN | 6.1 | 8.071 | <0.05 | 3.28 | 99.8 |
| Comparative Example 7 | AlN, MgAl$_2$O$_4$, ZrN | 7.9 | 8.084 | <0.05 | 3.29 | 99.8 |
| Comparative Example 8 | AlN, MgAl$_2$O$_4$, ZrN, MgO | 8.1 | 8.087 | <0.05 | 3.29 | 99.9 |

TABLE 3-continued

Sintered Body Properties

| | Constituent Phase | MgAl$_2$O$_4$ Weight % | Lattice Constant of MgAl$_2$O$_4$ angstrom | Open Porosity % | Bulk Density g/cm$^3$ | Relative Density % |
|---|---|---|---|---|---|---|
| Comparative Example 9 | AlN, MgAl$_2$O$_4$, ZrN | 14 | 8.084 | <0.05 | 3.31 | 99.8 |
| Example 1 | AlN, MgAl$_2$O$_4$, ZrN | 17 | 8.084 | <0.05 | 3.32 | 99.9 |
| Example 2 | AlN, MgAl$_2$O$_4$, ZrN | 23 | 8.084 | <0.05 | 3.33 | 99.9 |
| Example 3 | AlN, MgAl$_2$O$_4$, ZrN | 50 | 8.083 | <0.05 | 3.42 | 99.9 |
| Example 4 | AlN, MgAl$_2$O$_4$, ZrN | 64 | 8.083 | <0.05 | 3.45 | 99.7 |
| Comparative Example 10 | AlN, MgAl$_2$O$_4$, ZrN | 14 | 8.085 | <0.05 | 3.31 | 99.8 |
| Example 5 | AlN, MgAl$_2$O$_4$, ZrN | 17 | 8.085 | <0.05 | 3.32 | 99.8 |
| Example 6 | AlN, MgAl$_2$O$_4$, ZrN | 21 | 8.085 | <0.05 | 3.33 | 99.8 |
| Example 7 | AlN, MgAl$_2$O$_4$, ZrN | 49 | 8.084 | <0.05 | 3.42 | 99.7 |
| Example 8 | AlN, MgAl$_2$O$_4$, ZrN | 65 | 8.084 | <0.05 | 3.45 | 99.7 |
| Comparative Example 11 | AlN, MgAl$_2$O$_4$, ZrN | 14 | 8.087 | <0.05 | 3.31 | 99.8 |
| Example 9 | AlN, MgAl$_2$O$_4$, ZrN | 17 | 8.087 | <0.05 | 3.32 | 99.7 |
| Example 10 | AlN, MgAl$_2$O$_4$, ZrN | 21 | 8.087 | <0.05 | 3.33 | 99.8 |
| Example 11 | AlN, MgAl$_2$O$_4$, ZrN | 49 | 8.086 | <0.05 | 3.42 | 99.8 |
| Example 12 | AlN, MgAl$_2$O$_4$, ZrN | 64 | 8.086 | <0.05 | 3.45 | 99.7 |
| Example 13 | AlN, MgAl$_2$O$_4$, ZrN | 22 | 8.086 | <0.05 | 3.34 | 99.9 |
| Example 14 | AlN, MgAl$_2$O$_4$, ZrN | 22 | 8.082 | <0.05 | 3.34 | 99.8 |
| Example 15 | AlN, MgAl$_2$O$_4$, ZrN | 22 | 8.084 | <0.05 | 3.34 | 99.7 |
| Example 16 | AlN, MgAl$_2$O$_4$, ZrN | 22 | 8.084 | <0.05 | 3.34 | 99.8 |
| Example 17 | AlN, MgAl$_2$O$_4$, ZrN | 22 | 8.083 | <0.05 | 3.34 | 99.9 |
| Example 18 | AlN, MgAl$_2$O$_4$, ZrN | 48 | 8.082 | <0.05 | 3.42 | 99.7 |
| Example 19 | AlN, MgAl$_2$O$_4$, ZrN | 49 | 8.083 | <0.05 | 3.42 | 99.8 |

<Evaluation>

The composite sintered body obtained by the above-described sintering is processed for each type of evaluation and evaluations shown in Tables 2 and 3 are performed.

As to the constituent phase of the composite sintered body, a crystal phase of powder in which silicon (Si) powder as an internal standard sample is added and mixed to the composite sintered body which is crushed by using a mortar is identified by an X-ray diffraction (XRD) apparatus. The measurement conditions are that CuKα, 40 kV, 40 mA, and 2θ=20 to 80°, and a sealed-tube X-ray diffraction apparatus (D8-ADVANCE manufactured by Bruker AXS) is used. The step width of the measurement is 0.02°.

The percentage of MgAl$_2$O$_4$ contained in the composite sintered body is calculated from following Equation 1 derived from X-ray diffraction patterns of the mixture on which respective weight ratios of constituent phases are already known, by using calibration curves.

The amount of MgAl$_2$O$_4$(weight percentage)=(1.0× (311)surface peak intensity of MgAl$_2$O$_4$)/(1.0× (100)surface peak intensity of AlN+1.0×(311) surface peak intensity of MgAl$_2$O$_4$+0.22×(200) surface peak intensity of ZrN+1.8×(200)surface peak intensity of MgO)×100.  (Equation 1)

Figure 4:
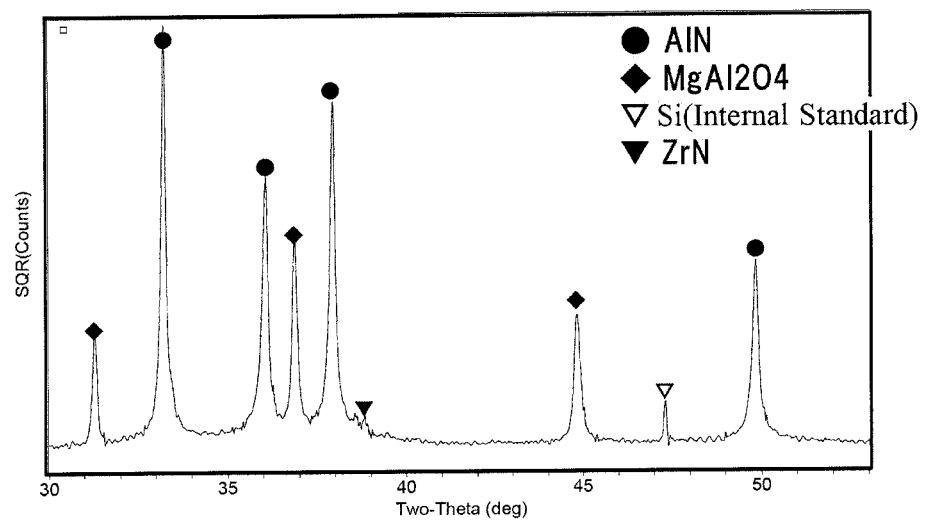
FIG. 4 is a view showing an X-ray diffraction pattern of a composite sintered body in Example.

The content percentages of MgO in the composite sintered bodies in Examples 1 to 19 and Comparative examples 6 to 11, which are calculated by the same method, are from 0 weight percentage to 2 weight percentage. Further, that the content percentage is 0 weight percentage means that there is no main peak of the crystal phase in the XRD even assuming that the vertical axis is used as a square root scale. In FIG. 4 described later, for example, since there is no main peak of MgO in the vicinity of 2θ=43°, it is determined that the content percentage of the MgO crystal phase is 0 weight percentage. Furthermore, the content percentages of zirconium nitride (ZrN) in the composite sintered bodies in Examples 1 to 14 and 18 to 19 and Comparative examples 6 to 11 (specifically, Examples in which the ZrO$_2$ powder is not intentionally added), which are calculated by the same method, are from 0.5 weight percentage to 1.5 weight percentage. This ZrN is obtained when $ZrO_2$ which is an impurity caused by the balls of the ball mill (so-called pebble contamination) is nitrided due to sintering.

The lattice constant of $MgAl_2O_4$ is calculated by the WPPD (Whole Powder Pattern Decomposition) method (powder pattern fitting method) using software (TOPAS manufactured by Bruker AXS).

The open porosity and the bulk density are measured by the Archimedes' method using pure water as a solvent.

The relative density is a percentage of a value obtained by dividing the bulk density by a theoretical density. The theoretical density is obtained on the basis of the content percentage (weight percentage) calculated by the above-described method (see Equation 1) and the theoretical density of each crystal phase. The theoretical density of AlN is 3.26 (g/cm$^3$), that of $MgAl_2O_4$ is 3.58 (g/cm$^3$), that of ZrN is 7.29 (g/cm$^3$), and that of MgO is 3.56 (g/cm$^3$).

The volume resistivity is measured by the method in conformity with "JIS C2141" under vacuum atmosphere. The specimen configuration is φ50 mm×1 mm. The diameter of a main electrode is 20 mm. The inner diameter and the outer diameter of a guard electrode are 30 mm and 40 mm, respectively. The diameter of an application electrode is 45 mm. The main electrode, the guard electrode, and the application electrode are formed of Ag (silver). The applied voltage is 500 V/mm. A current value after one minute has elapsed from voltage application is read and the volume resistivity is calculated from the current value. Table 2 shows volume resistivities at room temperature, 600° C., and 700° C.

The etching rate is obtained by dividing the depth of etching on the composite sintered body by the depth of etching on the sintered body in Comparative example 1 in a state where plasma etching has been performed on the composite sintered body in each of Examples and Comparative examples for a predetermined time under the following conditions. Assuming that the plasma etching rate of the sintered body in Comparative example 1 is 1, obtained is the plasma etching rate (hereinafter, referred to as a "relative etching rate") of the composite sintered body. As the relative etching rate is smaller, the plasma corrosion resistance becomes higher. The relative etching rate of the composite sintered body is preferably not higher than 0.5, and more preferably not higher than 0.35.

In this plasma etching, the composite sintered body is mirror-polished and placed in a chamber, and then exposed in radio frequency plasma environment of the ICP (Inductively Coupled Plasma) method for 24 hours. Into the chamber, chlorine ($Cl_2$) gas is supplied with a flow rate of 300 ml/min, and nitrogen ($N_2$) gas is supplied with a flow rate of 100 ml/min. The chamber internal pressure is 0.1 Torr (about 13.3 Pa). The supply power for plasma generation is 800 W. A mask is provided over part of an upper surface of the composite sintered body, and after plasma etching, the level difference between the masked surface of the composite sintered body and the exposed surface (i.e., the surface provided with no mask) is obtained as the depth of etching.

For obtaining the thermal conductivity, the specific heat and the thermal diffusivity of the composite sintered body are measured by differential scanning calorimetry (DSC) and the laser flash method, respectively, in a vacuum, and then the thermal conductivity is calculated by multiplying the specific heat, the thermal diffusivity, and the bulk density. Table 2 shows thermal conductivities at room temperature and 600° C.

Comparative Examples 1 to 5

The sintering temperature in Comparative examples 1 to 5 is 1800° C. The constituent phase of the sintered body in Comparative example 1 is MN single phase. The volume resistivity at 700° C. is low, specifically lower than $1.0 \times 10^7$ Ω·cm. The constituent phase of the sintered body in Comparative example 2 is also AlN single phase. Though MgO added as a raw material is contained in AlN particles in a state of being solid-solved, since the amount of Mg is small, the volume resistivity at 700° C. is low, specifically lower than $1.0 \times 10^7$ Ω·cm.

The constituent phase of the sintered body in Comparative examples 3 to 5 includes MN and MgO. MgO added as a raw material is contained in AlN particles in a state of being solid-solved and as MgO. In Comparative example 3, though the volume resistivity at 700° C. is not lower than $1.0 \times 10^8$ Ω·cm, the etching rate is larger than 0.5 and the plasma corrosion resistance is low. On the other hand, in Comparative examples 4 to 5, the etching rate is not higher than 0.5 but the volume resistivity at 700° C. is lower than $1.0 \times 10^8$ Ω·cm. In Comparative example 5, the volume resistivity at 700° C. is lower than $7.0 \times 10^7$ Ω·cm.

Comparative Examples 6 to 8

In Comparative examples 6 to 8, the amounts of $MgAl_2O_4$ in the raw material are equal to one another and the amounts of MgO are different from one another. Further, the sintering temperature in Comparative examples 6 to 8 is 1800° C. In Comparative example 6, the raw material does not include MgO, and the constituent phase of the composite sintered body includes AlN, $MgAl_2O_4$, and ZrN. The content percentage of $MgAl_2O_4$ is lower than 15 weight percentage. As described above, ZrN is obtained when impurity $ZrO_2$ caused by the balls of the ball mill is nitrided due to sintering. Since the amount of ZrN is very small, substantially no effect is produced on the properties of the composite sintered body. The same applies to Examples 1 to 14 and Comparative examples 7 to 11.

MgO in Comparative example 7 is solid-solved by sintering in AlN like in Comparative examples 1 to 5 and is reacted with the impurity $Al_2O_3$, to thereby become $MgAl_2O_4$. For this reason, the constituent phase of the composite sintered body in Comparative example 7 includes AlN, $MgAl_2O_4$, and ZrN. In Comparative example 8, since the amount of MgO is larger than that in Comparative example 7, MgO remains in the composite sintered body. The constituent phase of the composite sintered body in Comparative example 8 includes AlN, $MgAl_2O_4$, MgO, and ZrN. The content percentage of $MgAl_2O_4$ in Comparative examples 7 to 8 is lower than 15 weight percentage.

In Comparative examples 6 to 8, the volume resistivity at 700° C. is not lower than $7.0 \times 10^7$ Ω·cm, the relative etching rate is not higher than 0.5, and the thermal conductivity at 600° C. is not lower than 30 W/m·K. In Comparative example 7, the volume resistivity at 700° C. is not lower than $1.0 \times 10^8$ Ω·cm. In Comparative example 7, since the amount of MgO in the raw material is larger than that in Comparative example 6, it can be thought that the amount of Mg solid-solved in AlN of the composite sintered body becomes larger and the volume resistivity becomes higher.

The lattice constant of $MgAl_2O_4$ in Comparative example 6 is 8.071 angstrom and is smaller than 8.083 angstrom which is a theoretical value (i.e., the lattice constant in a case where the ratio between the amount of substance of MgO in MgAl$_2$O$_4$ and that of Al$_2$O$_3$ is 1:1). Therefore, MgAl$_2$O$_4$ in Comparative example 6 is MgAl$_2$O$_4$ in which the proportion of MgO is relatively small. On the other hand, the lattice constant of MgAl$_2$O$_4$ in Comparative example 7 is 8.084 angstrom and is substantially the same as the theoretical value. For this reason, it can be thought that the volume resistivity of the composite sintered body in Comparative example 7 becomes higher than that in Comparative example 6. Further, in Comparative example 6, it can be thought that Mg component in the composite sintered body is used to form MgAl$_2$O$_4$ and the amount of Mg solid-solved in AlN becomes smaller than that in Comparative example 7. Also from this, it can be thought that the volume resistivity in Comparative example 7 becomes higher than that in Comparative example 6.

Examples 1 to 4 and Comparative Example 9

In Examples 1 to 4 and Comparative example 9, the amounts of MgO in the raw material are equal to that in Comparative example 7 and the amounts of MgAl$_2$O$_4$ are different from one another. Further, the sintering temperature in Examples 1 to 4 and Comparative example 9 is 1800° C. The constituent phase of the composite sintered body in Examples 1 to 4 and Comparative example 9 includes AlN, MgAl$_2$O$_4$, and ZrN, like in Comparative example 7. The content percentage of MgAl$_2$O$_4$ in Examples 1 to 4 is not lower than 15 weight percentage. The content percentage of MgAl$_2$O$_4$ in Comparative example 9 is lower than 15 weight percentage.

In Examples 1 to 4, the volume resistivity at 700° C. is not lower than 1.0×10$^8$ Ω·cm, the relative etching rate is not higher than 0.5, and the thermal conductivity at 600° C. is not lower than 15 W/m·K. In Examples 1 to 2, the thermal conductivity at 600° C. is not lower than 30 W/m·K. In Examples 3 to 4, the relative etching rate is not higher than 0.35. The relative density in Examples 1 to 4 is not lower than 99.5% (in more detail, not lower than 99.7%).

Examples 5 to 8 and Comparative Example 10

In Examples 5 to 8 and Comparative example 10, the amounts of MgO in the raw material are equal to that in Comparative example 7 and the amounts of MgAl$_2$O$_4$ are different from one another. The amounts of MgAl$_2$O$_4$ in the raw material in Examples 5 to 8 and Comparative example 10 are equal to those in Examples 1 to 4 and Comparative example 9, respectively. Further, the sintering temperature in Examples 5 to 8 and Comparative example 10 is 1700° C. The constituent phase of the composite sintered body in Examples 5 to 8 and Comparative example 10 includes AlN, MgAl$_2$O$_4$, and ZrN, like in Comparative example 7. The content percentage of MgAl$_2$O$_4$ in Examples 5 to 8 is not lower than 15 weight percentage. The content percentage of MgAl$_2$O$_4$ in Comparative example 10 is lower than 15 weight percentage.

In Examples 5 to 8, the volume resistivity at 700° C. is not lower than 1.0×10$^8$ Ω·cm, the relative etching rate is not higher than 0.5, and the thermal conductivity at 600° C. is not lower than 15 W/m·K. In Examples 5 to 6, the thermal conductivity at 600° C. is not lower than 30 W/m·K. In Examples 7 to 8, the relative etching rate is not higher than 0.35. The relative density in Examples 5 to 8 is not lower than 99.5% (in more detail, not lower than 99.7%).

Examples 9 to 12 and Comparative Example 11

In Examples 9 to 12 and Comparative example 11, the amounts of MgO in the raw material are equal to that in Comparative example 7 and the amounts of MgAl$_2$O$_4$ are different from one another. The amounts of MgAl$_2$O$_4$ in the raw material in Examples 9 to 12 and Comparative example 11 are equal to those in Examples 1 to 4 and Comparative example 9, respectively. Further, the sintering temperature in Examples 9 to 12 and Comparative example 11 is 1650° C. The constituent phase of the composite sintered body in Examples 9 to 12 and Comparative example 11 includes AlN, MgAl$_2$O$_4$, and ZrN, like in Comparative example 7. The content percentage of MgAl$_2$O$_4$ in Examples 9 to 12 is not lower than 15 weight percentage. The content percentage of MgAl$_2$O$_4$ in Comparative example 11 is lower than 15 weight percentage.

In Examples 9 to 12, the volume resistivity at 700° C. is not lower than 1.0×10$^8$ Ω·cm, the relative etching rate is not higher than 0.5, and the thermal conductivity at 600° C. is not lower than 15 W/m·K. In Examples 9 to 10, the thermal conductivity at 600° C. is not lower than 30 W/m·K. In Examples 11 to 12, the relative etching rate is not higher than 0.35. The relative density in Examples 9 to 12 is not lower than 99.5% (in more detail, not lower than 99.7%).

Examples 13 to 17

In Examples 13 to 17, the substantial amounts of MgO and those of MgAl$_2$O$_4$ are equal to one another. The amount of ZrO$_2$ in Table 1 is the amount of ZrO$_2$ added to the raw material separately from the above-described impurity ZrO$_2$ caused by the balls of the above-described ball mill. As described above, in Example 13, the above-described commercially-available Al$_2$O$_3$ powder is added to the raw material, and in Examples 14 to 17, Al$_2$O$_3$ generated by partially oxidizing AlN which is the raw material at 900° C. under the atmosphere is contained in the raw material. Further, the sintering temperature in Examples 13 to 17 is 1700° C.

The amount of substance of MgO in Examples 13 to 17 is larger than the total amount of substance of above-described Al$_2$O$_3$ added to the raw material and Al$_2$O$_3$ inevitably contained as impurities in the AlN powder (i.e., impurity Al$_2$O$_3$), and MgO is solid-solved in AlN by sintering and reacted with Al$_2$O$_3$, to thereby become MgAl$_2$O$_4$. For this reason, the constituent phase of the composite sintered body in Examples 13 to 17 includes AlN, MgAl$_2$O$_4$, and ZrN. The content percentage of MgAl$_2$O$_4$ in Examples 13 to 17 is not lower than 15 weight percentage.

In Examples 13 to 17, the volume resistivity at 700° C. is not lower than 1.0×10$^8$ Ω·cm, the relative etching rate is not higher than 0.5, and the thermal conductivity at 600° C. is not lower than 15 W/m·K. The relative density in Examples 13 to 17 is not lower than 99.5% (in more detail, not lower than 99.7%). From Examples 13 to 14, it can be seen that the additive is not limited to MgAl$_2$O$_4$ but may be the mixture of Al$_2$O$_3$ and MgO, and it can be further seen that Al$_2$O$_3$ may be generated by oxidizing AlN which is raw material. Further, from Examples 14 to 17, it can be seen that even when ZrO$_2$ of 0.5 to 2.0 parts by weight is added to the raw material, almost no effect is produced on the properties of the composite sintered body to be generated.

Examples 18 to 19

In Examples 18 to 19, the amounts of MgAl$_2$O$_4$ in the raw material are equal to that in Example 7 and the amounts of MgO are smaller than that in Example 7. Further, the sintering temperature in Examples 18 to 19 is 1700° C. like in Example 7. The constituent phase of the composite sintered body in Examples 18 to 19 includes AlN, MgAl$_2$O$_4$, and ZrN like in Example 7. The content percentage of $MgAl_2O_4$ in Examples 18 to 19 is not lower than 15 weight percentage.

In Examples 18 to 19, the volume resistivity at 700° C. is not lower than $1.0 \times 10^8$ Ω·cm, and in more detail, not lower than $1.0 \times 10^9$ Ω·cm. In Examples 18 to 19, the relative etching rate is not higher than 0.35, and the thermal conductivity at 600° C. is not lower than 20 W/m·K. The relative density in Examples 18 to 19 is not lower than 99.5% (in more detail, not lower than 99.7%).

In Example 19, the amount of substance of MgO added to the raw material is smaller than that of $Al_2O_3$ inevitably contained as impurities in the AlN powder (i.e., impurity $Al_2O_3$). Further, in Example 18, the amount of substance of MgO added to the raw material is 0. In Examples 18 to 19, however, unlike in Comparative example 6, since the amount of substance of $MgAl_2O_4$ added to the raw material is relatively large, it can be thought that the effect of the impurity $Al_2O_3$ on the properties of the composite sintered body is small. Therefore, it can be thought that the lattice constant of $MgAl_2O_4$ included in the composite sintered body is almost not changed from the 8.083 angstrom which is the theoretical value and the volume resistivity of the composite sintered body is not reduced as compared with Comparative example 6.

Examples 1 to 19

The percentage of $MgAl_2O_4$ contained in the composite sintered body in Examples 1 to 19 is from 15 weight percentage to 70 weight percentage. Further, the open porosity of the composite sintered body is lower than 0.05%. The relative density of the composite sintered body in Examples 1 to 19 is not lower than 99.5% (in more detail, not lower than 99.7%).

<Comparison of Constituent Phases>

Figure 3:
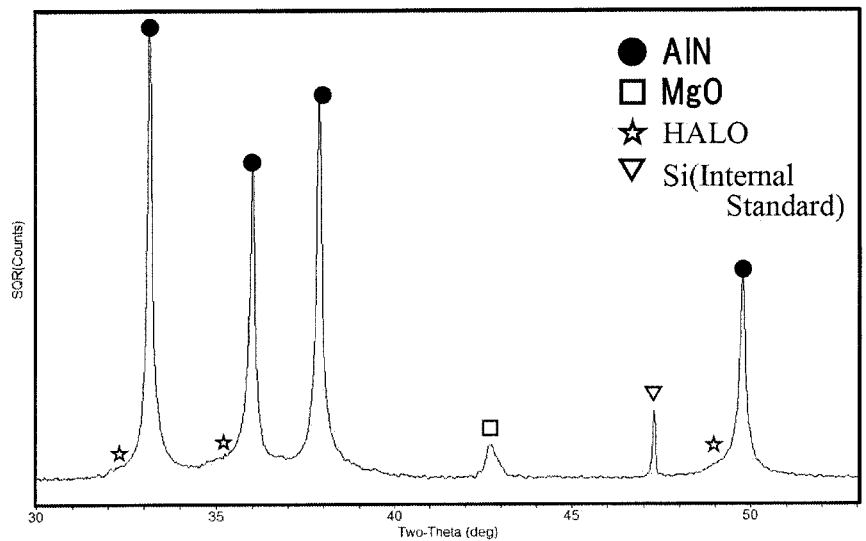
FIG. 3 is a view showing an X-ray diffraction pattern of a composite sintered body in Comparative example.

FIGS. 3 and 4 show X-ray diffraction patterns of the composite sintered bodies in Comparative example 4 and Example 2, respectively, in a state where the constituent phase is identified by the above-described X-ray diffraction apparatus. In Comparative example 4, there appears halo corresponding to scattering light due to an amorphous phase in the vicinity of 2θ=32°, 35°, and 49°. It can be thought that the amorphous phase is MgAlON or the like generated when AlN in the raw material and excess MgO (i.e., MgO which is not solid-solved in AlN) are reacted with each other by sintering. It can be thought that in the composite sintered body in Comparative example 4, the volume resistivity and the thermal conductivity are reduced since the composite sintered body includes the amorphous phase. On the other hand, in Example 2, there is no halo unlike in Comparative example 4 and Mg component exists in the composite sintered body as stable $MgAl_2O_4$ crystal phase. For this reason, it can be thought that in the composite sintered body in Example 2, it is possible to achieve high volume resistivity and high thermal conductivity.

Figure 5:
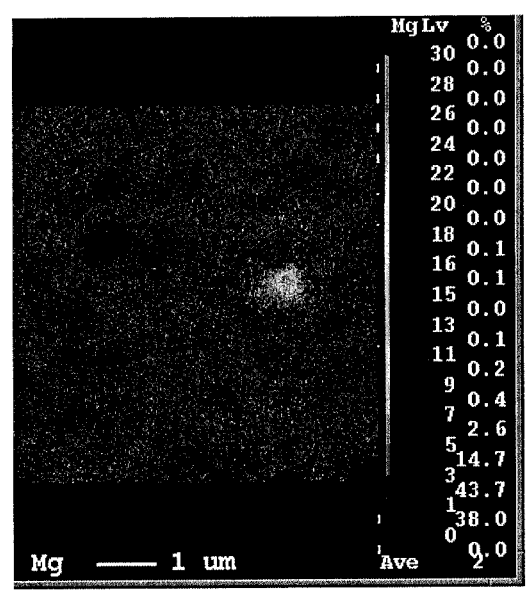
FIG. 5 is a view showing an elemental mapping image of the composite sintered body in Comparative example.
Figure 6:
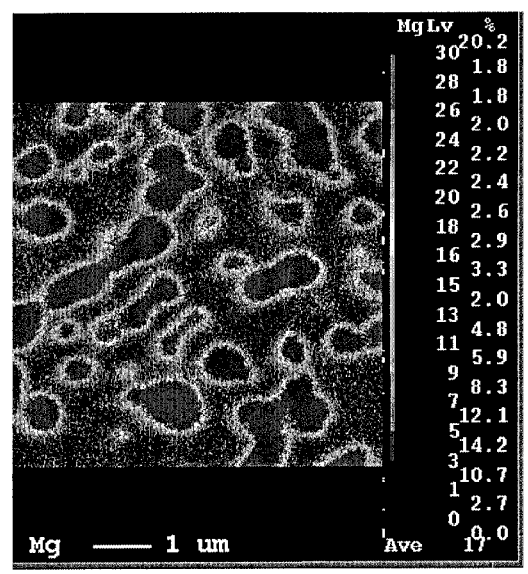
FIG. 6 is a view showing an elemental mapping image of the composite sintered body in Example.

FIGS. 5 and 6 show elemental mapping images (with a magnification of 3000 times) of Mg in the composite sintered bodies in Comparative example 3 and Example 6, which are obtained by the FE-EPMA (Field Emission Electron Probe Micro Analyzer). The elemental mapping image is color-coded into red, orange, yellow, yellow green, green, blue, and indigo blue depending on the concentration, and red indicates the highest concentration, indigo blue indicates the lowest concentration, and black indicates a concentration of 0. Since FIGS. 5 and 6 show black and white images, however, original colors in FIGS. 5 and 6 will be described below. In Comparative example 3 of FIG. 5, the background is shown in indigo blue to blue, and one point-like portion is shown in yellow green to red. The point-like portion corresponds to MgO, and the background portion corresponds to Mg solid-solved in AlN. In Example 6 of FIG. 6, the background is shown in indigo blue to blue, and a plurality of island-shaped portions are shown in yellow green to red. The plurality of island-shaped portions correspond to $MgAl_2O_4$, and the background portion corresponds to Mg solid-solved in AlN.

As described above, the above-described composite sintered body includes AlN and $MgAl_2O_4$. The open porosity of the composite sintered body is lower than 0.1%. The relative density of the composite sintered body is not lower than 99.5%. The total percentage of AlN and $MgAl_2O_4$ contained in the composite sintered body is not lower than 95 weight percentage and not higher than 100 weight percentage. The percentage of $MgAl_2O_4$ contained in the composite sintered body is not lower than 15 weight percentage and not higher than 70 weight percentage. Thus, in the composite sintered body, both the high content percentage of $MgAl_2O_4$ (not lower than 15 weight percentage) and the high relative density (not lower than 99.5%) can be achieved. It is thereby possible to provide a high-density composite sintered body having high plasma corrosion resistance, high volume resistivity, and high thermal conductivity.

Specifically, assuming that the plasma etching rate of a sintered body containing AlN in an amount of 100 weight percentage is 1, it is preferable that the plasma etching rate (i.e., the relative etching rate) of the composite sintered body should be not higher than 0.5. It is thereby possible to achieve high plasma corrosion resistance in the composite sintered body. The relative etching rate is more preferably not higher than 0.35.

It is preferable that the volume resistivity of the composite sintered body at 700° C. should be not lower than $7.0 \times 10^7$ Ω·cm. It is thereby possible to prevent or suppress leakage of current through the composite sintered body. The volume resistivity is more preferably not lower than $1.0 \times 10^8$ Ω·cm, and further preferably not lower than $3.0 \times 10^8$ Ω·cm.

It is preferable that the thermal conductivity of the composite sintered body at 600° C. should be not lower than 15 W/m·K. It is thereby possible to perform heating of the substrate 9 through the composite sintered body with high efficiency while suppressing variation in the temperature depending on the position, to be smaller. The thermal conductivity is more preferably not lower than 20 W/m·K, and further preferably not lower than 30 W/m·K.

As described above, it is preferable that the percentage of MgO as the constituent crystal phase contained in the composite sintered body should be substantially 0 weight percentage. As can be seen from above-described Comparative example 8 and other Examples, it is thereby possible to increase the volume resistivity of the composite sintered body as compared with a case where the percentage of MgO contained in the composite sintered body is larger than 0 weight percentage.

In the composite sintered body, it is preferable that the lattice constant of $MgAl_2O_4$ should be not lower than 8.075 angstrom. Thus, by increasing the proportion of MgO in $MgAl_2O_4$, as can be seen from above-described Comparative example 6 and other Examples, it is possible to increase the volume resistivity of the composite sintered body.

In the composite sintered body, it is preferable that Mg should be solid-solved in AlN. It is thereby possible to increase the volume resistivity of the composite sintered body.

As described above, since the composite sintered body has high plasma corrosion resistance, high volume resistivity, and high thermal conductivity, the composite sintered body is suitable for a semiconductor manufacturing apparatus member to be used in a semiconductor manufacturing apparatus. The composite sintered body is especially suitable for a semiconductor manufacturing apparatus member to be used in a high-power semiconductor manufacturing apparatus such as a high-power etching apparatus or the like. As a preferable example of the semiconductor manufacturing apparatus member formed by using the composite sintered body, the above-described susceptor 1 may be adopted. As described above, the susceptor 1 includes the main body 21 formed of the composite sintered body and the resistance heating element 22 and the internal electrode 23 which are disposed inside the main body 21.

As described above, the method of manufacturing a composite sintered body includes a step (Step S11) of molding mixed powder in which AlN and the additive containing Mg, and Al are mixed, into a green body having a predetermined shape and a step (Step S12) of generating a composite sintered body containing AlN and $MgAl_2O_4$ by hot-press sintering of the green body. In Step S11, the total percentage of the AlN and the additive contained in the mixed powder is not lower than 95 weight percentage and not higher than 100 weight percentage. Further, the mixed powder contains Mg in an amount of not lower than 5 weight percentage and not higher than 18 weight percentage in terms of MgO and Al in an amount of not lower than 10 weight percentage and not higher than 44 weight percentage in terms of $Al_2O_3$. It is thereby possible to suitably manufacture a composite sintered body having high plasma corrosion resistance, high volume resistivity, and high thermal conductivity. Further, as described above, by performing hot-press sintering using a hot press die having high hermeticity, it is possible to suitably manufacture a high-density composite sintered body while suppressing volatilization of Mg.

As described above, in Step S11, it is preferable that the additive should contain $MgAl_2O_4$ and MgO. As can be seen from Examples 1 to 12 and 19, it is thereby possible to easily manufacture the above-described composite sintered body.

Further, in Step S11, it is preferable that the additive should contain MgO and $Al_2O_3$. As can be seen from Examples 13 to 17, also in this case, it is thereby possible to easily manufacture the above-described composite sintered body.

The above-described composite sintered body, semiconductor manufacturing apparatus member, and manufacture of a composite sintered body allow various variations.

For example, the percentage of MgO as the constituent phase contained in the above-described composite sintered body may be larger than 0 weight percentage.

The lattice constant of the $MgAl_2O_4$ in the composite sintered body may be lower than 8.075 angstrom.

In the composite sintered body, Mg may not be solid-solved in AlN.

Assuming that the plasma etching rate of the sintered body containing AlN in an amount of 100 weight percentage is 1, the plasma etching rate of the above-described composite sintered body may be higher than 0.5.

The volume resistivity of the composite sintered body at 700° C. may be lower than $7.0 \times 10^7$ Ω·cm.

The thermal conductivity of the composite sintered body at 600° C. may be lower than 15 W/m·K.

In the method of manufacturing a composite sintered body, the above-described additive does not necessarily have to contain MgO, and the percentage of MgO contained in the additive may be substantially 0 weight percentage.

In the susceptor 1, only one of the resistance heating element 22 and the internal electrode 23 may be provided. The internal electrode 23 may be an electrode for electrostatic chuck. Alternatively, in the susceptor 1, in addition to the internal electrode 23 which is the RF electrode for plasma treatment, an electrode for electrostatic chuck may be also disposed inside the main body 21.

The susceptor 1 may be provided with a shaft part having a substantially columnar shape extending downward from a center portion of the lower surface 212 of the main body 21.

In the susceptor 1, part of the main body 21 (for example, only the upper surface 211 of the main body 21 or only the entire surface of the main body 21) may be formed of the above-described composite sintered body. In this case, the other part of the main body 21 is formed of a material different from that of the composite sintered body (for example, an AlN sintered body having substantially no $MgAl_2O_4$).

The above-described composite sintered body may be used for forming a semiconductor manufacturing apparatus member (for example, a ring, a dome, or the like) provided in a semiconductor manufacturing apparatus, other than the susceptor 1. Further, a member used in an apparatus other than the semiconductor manufacturing apparatus may be formed of the composite sintered body. For example, the composite sintered body may be used for forming a susceptor for supporting a substrate other than the semiconductor substrate, and may be used for forming a ceramic heater for heating an object.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

INDUSTRIAL APPLICABILITY

The present invention can be used in fields relating to a semiconductor manufacturing apparatus, for example, manufacture of a susceptor for supporting a semiconductor substrate. This application claims priority benefit under 35 U.S.C. Section 119 of PCT international application No. PCT/JP2018/011775 filed in the World Intellectual Property Organization on Mar. 23, 2018 and Japanese Patent Application No. 2019-21966 filed in the Japan Patent Office on Feb. 8, 2019, the entire disclosures of which are incorporated herein by reference.

REFERENCE SIGNS LIST

1 Susceptor
9 Substrate
21 Main body
22 Resistance heating element
23 Internal electrode
211 Upper surface (of main body)
S11 to S12 Step

The invention claimed is:
1. A composite sintered body, comprising:
aluminum nitride; and
spinel,
wherein the open porosity is lower than 0.1%, the relative density is not lower than 99.5%, the total percentage of said aluminum nitride and said spinel contained in said composite sintered body is not lower than 95 weight percentage and not higher than 100 weight percentage, and the percentage of said spinel contained in said composite sintered body is not lower than 15 weight percentage and not higher than 70 weight percentage.

2. The composite sintered body according to claim 1, wherein the percentage of magnesium oxide as a constituent crystal phase contained in said composite sintered body is substantially 0 weight percentage.

3. The composite sintered body according to claim 1, wherein the lattice constant of said spinel is not lower than 8.075 angstrom.

4. The composite sintered body according to claim 1, wherein magnesium is solid-solved in said aluminum nitride.

5. The composite sintered body according to claim 1, wherein assuming that the plasma etching rate of a sintered body containing aluminum nitride in an amount of 100 weight percentage is 1, the plasma etching rate of said composite sintered body is not higher than 0.5.

6. The composite sintered body according to claim 1, wherein the volume resistivity at 700° C. is not lower than $7.0 \times 10^7$ Ω·cm.

7. The composite sintered body according to claim 1, wherein the thermal conductivity at 600° C. is not lower than 15 W/m K.

8. A semiconductor manufacturing apparatus member used in a semiconductor manufacturing apparatus, being formed by using said composite sintered body according to claim 1.

9. The semiconductor manufacturing apparatus member according to claim 8, comprising:

a plate-like main body formed by using said composite sintered body, having an upper surface on which a semiconductor substrate is placed;

a resistance heating element disposed inside said main body; and an internal electrode disposed between said resistance heating element and said upper surface of said main body inside said main body.

10. A method of manufacturing the composite sintered body according to claim 1, comprising the steps of:

a) molding mixed powder in which aluminum nitride and an additive containing magnesium and aluminum are mixed, into a green body having a predetermined shape; and b) generating a composite sintered body containing aluminum nitride and spinel by hot-press sintering of said green body, wherein the total percentage of said aluminum nitride and said additive contained in said mixed powder is not lower than 95 weight percentage and not higher than 100 weight percentage in said operation a), and said mixed powder contains magnesium in an amount of not lower than 5 weight percentage and not higher than 18 weight percentage in terms of magnesium oxide, and aluminum in an amount of not lower than 10 weight percentage and not higher than 44 weight percentage in terms of aluminum oxide.

11. The method of manufacturing a composite sintered body according to claim 10, wherein said additive contains spinel and magnesium oxide.

12. The method of manufacturing a composite sintered body according to claim 10, wherein said additive contains magnesium oxide and aluminum oxide.

13. The composite sintered body according to claim 1, wherein the percentage of said spinel contained in said composite sintered body is not lower than 18 weight percentage.

* * * * *